(12) United States Patent
Wu et al.

(10) Patent No.: US 9,564,351 B2
(45) Date of Patent: Feb. 7, 2017

(54) POSITIONING FRAME STRUCTURE

(71) Applicant: Sensata Technologies (Changzhou) Co., Ltd.

(72) Inventors: Tianshun Wu, Shanghai (CN); Chengwei Huang, Shanghai (CN); Xiaochi Xu, Shanghai (CN)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 63 days.

(21) Appl. No.: 14/584,207

(22) Filed: Dec. 29, 2014

(65) Prior Publication Data

US 2015/0187623 A1 Jul. 2, 2015

(30) Foreign Application Priority Data

Dec. 31, 2013 (CN) .......................... 2013 1 0752418

(51) Int. Cl.
| | |
|---|---|
| *A47B 91/00* | (2006.01) |
| *H01L 21/68* | (2006.01) |
| *H01L 21/673* | (2006.01) |
| *G01P 1/02* | (2006.01) |
| *G01P 3/488* | (2006.01) |
| *G01D 11/24* | (2006.01) |
| *G01D 11/30* | (2006.01) |

(52) U.S. Cl.
CPC ............ *H01L 21/68* (2013.01); *G01D 11/245* (2013.01); *G01D 11/30* (2013.01); *G01P 1/026* (2013.01); *G01P 3/488* (2013.01); *H01L 21/67353* (2013.01)

(58) Field of Classification Search
USPC .................................................... 248/346.03

IPC .................... G01P 1/026,3/488; B65D 19/0002
See application file for complete search history.

(56) References Cited

U.S. PATENT DOCUMENTS

| | | | | | |
|---|---|---|---|---|---|
| 2,965,235 | A | * | 12/1960 | Daline .................. | A47F 5/0823 211/1 |
| 5,093,617 | A | * | 3/1992 | Murata .................. | 123/146.5 A |
| 5,255,795 | A | * | 10/1993 | Kitmitto .................. | B01L 9/00 206/818 |
| 5,321,355 | A | * | 6/1994 | Luetzow ................ | G01B 7/023 324/174 |
| 5,581,179 | A | * | 12/1996 | Engel ..................... | G01D 5/147 174/556 |

(Continued)

*Primary Examiner* — Monica Millner
(74) *Attorney, Agent, or Firm* — Adler Pollock & Sheehan P.C.; George N. Chaclas, Esq.; Daniel J. Holmander, Esq.

(57) ABSTRACT

A positioning frame structure for the centering and positioning of an IC is disclosed, in which the positioning frame structure comprises an IC carrier having a first chamber defined therein and an IC positioning magnet disposed in the first chamber of the IC carrier. The positioning frame structure further comprises an IC holder disposed over the IC positioning magnet, and the IC is held on the IC holder, so as to provide centering and positioning of the IC relative to the IC positioning magnet. The present invention can be used to control the centering and positioning of the IC and the positioning magnet on the carrier. The positioning magnet can be made to be larger than the IC. In addition, a large air gap can be obtained so as to facilitate the subsequent operation of the IC. Furthermore, without the operation using adhesive, the technical solution of the present invention saves the cost of operation.

16 Claims, 1 Drawing Sheet

(56) References Cited

U.S. PATENT DOCUMENTS

| | | | | |
|---|---|---|---|---|
| 5,868,251 A * | 2/1999 | Lin | | B25H 3/003 |
| | | | | 206/372 |
| 6,018,130 A * | 1/2000 | Haack | | H01H 35/022 |
| | | | | 200/61.45 M |
| 6,288,533 B1 * | 9/2001 | Haeberli | | A61K 48/00 |
| | | | | 324/207.12 |
| 6,346,811 B1 * | 2/2002 | Smith, Jr. | | G01R 29/12 |
| | | | | 324/252 |
| 6,355,885 B1 * | 3/2002 | Rintz | | H01H 9/18 |
| | | | | 174/66 |
| 6,707,293 B2 * | 3/2004 | Wan | | G01D 5/145 |
| | | | | 324/207.14 |
| 7,710,110 B2 * | 5/2010 | Patil | | G01D 5/145 |
| | | | | 324/174 |
| 7,876,188 B2 * | 1/2011 | Tarng | | H03B 5/04 |
| | | | | 331/117 R |
| 8,043,544 B2 * | 10/2011 | Lotfi | | H01F 41/005 |
| | | | | 264/104 |
| 8,618,900 B2 * | 12/2013 | Lotfi | | H01F 17/0006 |
| | | | | 336/200 |
| 8,701,272 B2 * | 4/2014 | Lotfi | | H01F 17/04 |
| | | | | 29/602.1 |
| 8,727,326 B2 * | 5/2014 | Lin | | B25B 11/02 |
| | | | | 269/8 |
| 8,779,635 B2 * | 7/2014 | Subrahmanyan | | G03F 1/84 |
| | | | | 310/12.01 |
| 9,201,123 B2 * | 12/2015 | Elian | | G01R 33/0047 |
| 2003/0001083 A1 * | 1/2003 | Corrado | | G01D 11/245 |
| | | | | 250/239 |
| 2006/0202291 A1 * | 9/2006 | Kolb | | H01L 27/22 |
| | | | | 257/421 |
| 2006/0261801 A1 * | 11/2006 | Busch | | G01D 5/145 |
| | | | | 324/207.21 |
| 2007/0075705 A1 * | 4/2007 | Kurumado | | G01D 5/147 |
| | | | | 324/207.25 |
| 2008/0013298 A1 * | 1/2008 | Sharma | | G01D 11/245 |
| | | | | 361/813 |
| 2008/0309324 A1 * | 12/2008 | Stuve | | G01R 33/07 |
| | | | | 324/207.2 |
| 2010/0033170 A1 * | 2/2010 | Velasquez | | G01B 7/30 |
| | | | | 324/207.25 |
| 2012/0038350 A1 * | 2/2012 | Bender | | G01D 5/20 |
| | | | | 324/207.25 |
| 2014/0184263 A1 * | 7/2014 | Ehrenpfordt | | G01D 11/245 |
| | | | | 324/762.03 |
| 2014/0254835 A1 * | 9/2014 | Yakura | | H03F 3/181 |
| | | | | 381/120 |
| 2015/0070003 A1 * | 3/2015 | Elliott | | B60T 7/042 |
| | | | | 324/207.15 |
| 2015/0338242 A1 * | 11/2015 | Sticksel | | G01D 5/145 |
| | | | | 324/207.2 |

* cited by examiner

POSITIONING FRAME STRUCTURE

RELATED APPLICATIONS

This application is related to and claims priority to Chinese Patent Application No. 201310752418.3 filed Dec. 31, 2013, the entire teachings of which are incorporated herein by this reference.

TECHNICAL FIELD

The present invention is related to a positioning frame structure, and more particularly, to a positioning frame structure for accurate centering and positioning between an integrated chip and a positioning magnet.

BACKGROUND OF THE ART

It is well known that the speed of a target wheel can be detected using a non-contact encoder of a magnetic sensor, such as Hall sensor, anisotropy reluctance sensor and large reluctance sensor. Such sensor can be known as speed sensor, such as Two-Wire Hall Effect Directional Output Speed Sensor (TOSS), Integrated Directional Clutch Input Speed Sensor (CISS) and Non-directional Input Speed Sensor (TISS). The function, performance and design for these sensors are well known in the art. The speed sensors are capable of sensing rotational speed of a target utilized in automotive transmission application.

These speed sensors are used in both input and output encoder application during the target spinning. Typically, they have small package Integrated Chips (ICs) on the top side of magnets, with a magnet located in a carrier. During the operation process, the centering and positioning of the IC on the magnet are required to be controlled. In the prior art, the IC is generally assembled on the carrier, so that the centering between the IC and the magnet is controlled by means of the inner diameter of a hole in the carrier, and the positioning of the IC is controlled through ribs on the carrier. In this case, the magnet should has a size smaller than that of the IC in order to ensure that the centering can be performed, while the IC should be secured by an adhesive, which creates a problem of production cost.

Since the size of the magnet is smaller than that of the IC, the above solution is not suitable for a smaller IC. The operation of centering and positioning is complex, because the IC needs to be secured by an adhesive. Thus, there is a need for a positioning structure, which can be adapted to position an IC having a size smaller than a positioning magnet, and simplify the construction and operation and reduce the cost.

DESCRIPTION OF THE INVENTION

Therefore, an object of the present invention is to provide a positioning frame structure for accurate centering and positioning between an integrated chip and a positioning magnet. The positioning frame structure can be adapted to position an IC having a size smaller than a positioning magnet, and eliminate the need of adhesive in prior art, so as to reduce the cost.

The above object is achieved through a positioning frame structure for the centering and positioning of an IC, in which the positioning frame structure comprises:

an IC carrier having a first chamber defined therein; and an IC positioning magnet disposed in the first chamber of the IC carrier;

wherein the positioning frame structure further comprises an IC holder disposed over the IC positioning magnet, and the IC is held on the IC holder, so as to provide centering and positioning of the IC relative to the IC positioning magnet.

In one embodiment, the IC holder is formed with a receiving portion and the IC is held in the receiving portion.

In one embodiment, the receiving portion is sized and shaped to correspond to the size and shape of the IC, so that the IC can be fixedly disposed in the receiving portion.

In one embodiment, the IC positioning magnet is sized to correspond to the size of the first chamber of the IC carrier, so that the IC positioning magnet can be fixedly disposed in the first chamber.

In one embodiment, the size of the IC positioning magnet is larger than the size of the IC.

In one embodiment, the IC carrier also has a second chamber defined therein, wherein the second chamber is located above the first chamber.

In one embodiment, the IC holder is located within the second chamber of the IC carrier.

In one embodiment, the second chamber of the IC carrier is sized to be larger than the size of the first chamber of the IC holder.

In one embodiment, a shoulder is formed between the first chamber and the second chamber, and the IC holder is located within the second chamber of the IC carrier against the shoulder.

In one embodiment, the outer periphery of the IC holder is sized to correspond to the size of the second chamber of the IC carrier, so that the IC holder can be fixedly disposed within the second chamber.

By means of the above solution, the positioning frame structure of the present invention can be used to control and thus ensure the centering and positioning of the IC and the positioning magnet on the carrier. Due to the present of the IC holder, the positioning magnet can be made to be larger than the IC. In this case, the present invention can be used for the operation of a smaller IC, i.e. the IC can be used in a small package. In addition, a large air gap can be obtained so as to facilitate the subsequent operation of the IC.

Furthermore, without the operation using adhesive, the technical solution of the present invention saves the cost of operation as compared with the IC positioning manner in prior art.

DRAWINGS DESCRIPTION

The present invention will now be described in detail by means of embodiments of a positioning frame structure with reference to the accompanied figures, wherein.

DETAIL DESCRIPTION OF THE EMBODIMENTS OF THE PRESENT INVENTION

Referring to the figures, a positioning frame structure of the present invention will now be in detail described. The positioning frame structure of the present invention is used for the centering and positioning of an Integrated Chip (IC), especially the centering and positioning of an IC in small package on a large IC positioning magnet.

Figure 1:
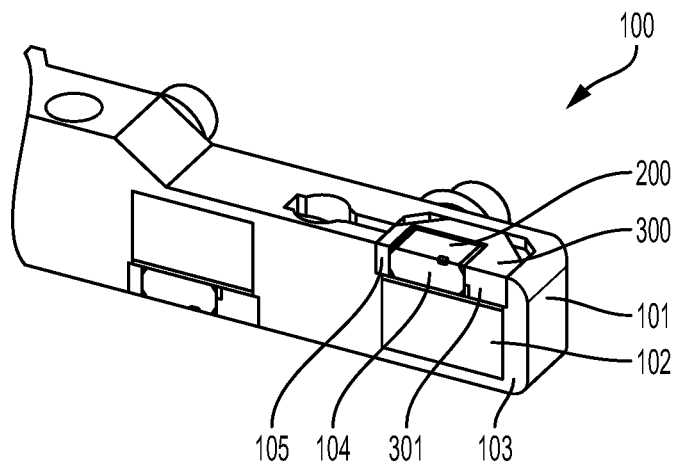
FIG. 1 is a longitudinal cross-sectional perspective view of a positioning frame structure according to the present invention.
Figure 2:
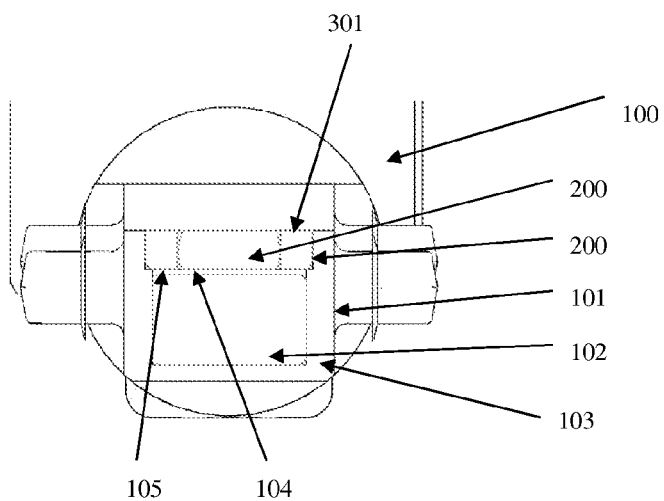
FIG. 2 is a traversal cross-sectional view of a positioning frame structure according to the present invention.

Referring now to FIGS. 1 and 2, which are a longitudinal cross-sectional perspective view and a traversal cross-sectional view of a positioning frame structure 100 according to the present invention, respectively. In the FIGS. 1 and 2, the positioning frame structure 100 generally comprises an IC carrier 101 and an IC positioning magnet 102. The IC carrier 101 has a first chamber 103 defined therein. In the illustrated embodiment, the cross section of the first chamber 103 is square in shape. However, it will be appreciated that the first chamber 103 can be any other suitable shape.

The IC positioning magnet 102 is disposed within the first chamber 103 of the IC carrier 101. Preferably, the IC positioning magnet 102 is sized to correspond to the size of the first chamber 103 of the IC carrier 101, so that the IC positioning magnet 102 can be fixedly disposed in the first chamber 103, and thus the centering and positioning between the IC positioning magnet 102 and the IC carrier 101 can be controlled and ensured.

The positioning frame structure 100 according to the present invention is provided with a IC holder 300, which is disposed over the IC positioning magnet 102. In practice, an IC 200 is held in the IC holder 300, so that the centering and positioning of the IC 200 relative to the IC positioning magnet 102 can be obtained by means of the IC holder 300.

It is noted that due to the IC holder 300, the size of the IC positioning magnet 102 can be larger than the size of the IC 200, so as to meet some special requirements in the field of chip package. Further, due to the IC holder 300, the size of the IC 200 can be very small, so as to overcome the drawback in prior art that the centering and positioning of the IC can not be obtained if the IC is in small package.

In one preferred embodiment, the IC holder 300 is provided with a receiving portion 301 and the IC 200 can be held in the receiving portion 301. Preferably, the receiving portion 301 is sized and shaped to correspond to the size and shape of the IC 200, so that the IC 200 can be fixedly and removably disposed in the receiving portion 301.

The IC carrier 101 is further provided with a second chamber 104. In the illustrated embodiment, the second chamber 104 is located above the first chamber 103. In the embodiment having the second chamber 104, the IC holder 300 can be disposed within the second chamber 104 of the IC carrier 101.

The size of the second chamber 104 of the IC carrier 101 can be lager, smaller than or equivalent to the size of the first chamber 103 of the IC carrier 101. In the illustrated preferred embodiment, the size of the second chamber 104 is larger than the size of the first chamber 103. In this case, in one embodiment, a shoulder 105 can be formed between the first chamber 103 and the second chamber 104. In the case of having the shoulder 105, the IC holder 300 can abut against the shoulder 105.

In a preferred embodiment, the outer periphery of the IC holder 300 is sized to correspond to the size of the second chamber 104 of the IC carrier 101, so that the IC holder 300 can be fixedly and removably disposed within the second chamber 104. The centering and positioning between the IC 200 and the IC positioning magnet 102 can be ensured by means of the structural relationship between the IC carrier 101, the IC positioning magnet 102 and the IC holder 300.

The IC holder 300 and the second chamber 104 can be suitable shapes, for example, in the illustrated embodiment, the second chamber 104 has a cross section of symmetric hexagon, and the IC holder 300 has a cross section of corresponding symmetric hexagon, so as to generally conform to that of the second chamber 104. In the illustrated embodiment, a plurality of sides (which can be part or all of the sides) of the IC holder 300 abut against the corresponding inner sides of the second chamber 104, so that the IC holder 300 can be secured in place relative to the second chamber 104.

It is apparent for the skilled in the art that the IC holder 300 and the second chamber 104 can be any other suitable shapes, as long as the centering and positioning between the IC 200 and the IC positioning magnet 102 can be ensured.

In addition, in order to further enhance the IC 200 being secured in the receiving portion 301 of the IC holder, an additional securing means can be provided, for example, the IC 200 can be secured in the receiving portion 301 by means of a snap fit.

By means of the above solution, the positioning frame structure of the present invention can be used to control and thus ensure the centering and positioning of the IC and the positioning magnet on the carrier. Due to the present of the IC holder, the positioning magnet can be made to be larger than the IC. In this case, the present invention can be used for the operation of a smaller IC, i.e. the IC can be used in a small package. In addition, a large air gap can be obtained so as to facilitate the subsequent operation of the IC.

Furthermore, without the operation using adhesive, the technical solution of the present invention saves the cost of operation as compared with the IC positioning manner in prior art.

While the present invention has been described in detail by way of the above preferred embodiments, it is obvious to the skilled in the art that the present invention does not limit to the above embodiments. Without departing from the spirit and scope of the invention, various modification, change and replace can be made, which are all contained within the scope of the invention.

What is claimed is:

1. A positioning frame structure for centering and positioning an integrated circuit (IC), in which the positioning frame structure comprises:
    an IC carrier having a first chamber defined therein and a second chamber defined therein,
    wherein the second chamber is located entirely above the first chamber;
    an IC positioning magnet disposed within the first chamber of the IC carrier; and
    an IC holder located within the second chamber of the IC carrier and disposed over the IC positioning magnet within the first chamber of the IC carrier, the IC holder being configured to hold the IC so as to provide the centering and the positioning of the IC relative to the IC positioning magnet.

2. The positioning frame structure according to claim 1, wherein the IC holder is formed with a receiving portion, and wherein the receiving portion is configured to hold the IC.

3. The positioning frame structure according to claim 2, wherein the receiving portion is sized and shaped to correspond to the size and shape of the IC, so that the IC can be fixedly disposed in the receiving portion.

4. The positioning frame structure according to claim 1, wherein the IC positioning magnet is sized to correspond to the size of the first chamber of the IC carrier, so that the IC positioning magnet can be fixedly disposed in the first chamber.

5. The positioning frame structure according to claim 1, wherein the size of the IC positioning magnet is larger than the size of the IC.

6. The positioning frame structure according to claim 1, wherein the second chamber of the IC carrier is sized to be larger than the size of the first chamber of the IC carrier.

7. The positioning frame structure according to claim 1, wherein a shoulder is formed between the first chamber and the second chamber, and the IC holder is located within the second chamber of the IC carrier against the shoulder.

8. The positioning frame structure according to claim 1, wherein the IC holder has an outer periphery sized to correspond to the size of the second chamber of the IC carrier, so that the IC holder can be fixedly disposed within the second chamber.

9. The positioning frame structure according to claim 6, wherein the IC holder has an outer periphery sized to correspond to the size of the second chamber of the IC carrier, so that the IC holder can be fixedly disposed within the second chamber.

10. The positioning frame structure according to claim 7, wherein the IC holder has an outer periphery sized to correspond to the size of the second chamber of the IC carrier, so that the IC holder can be fixedly disposed within the second chamber.

11. The positioning frame structure according to claim 1, wherein the second chamber of the IC carrier is sized to be smaller than the size of the first chamber of the IC carrier.

12. The positioning frame structure according to claim 1, wherein the second chamber of the IC carrier is sized to be equivalent to the size of the first chamber of the IC carrier.

13. The positioning frame structure according to claim 1, wherein the second chamber has a cross-section of a symmetric hexagon, and wherein the IC holder has a cross-section of a corresponding symmetric hexagon configured to conform to the cross-section of the second chamber.

14. The positioning frame structure according to claim 3, wherein the receiving portion is sized and shaped to correspond to the size and shape of the IC, so that the IC can be fixedly disposed in the receiving portion by a snap-fit.

15. A method of a positioning frame structure for centering and positioning an integrated circuit (IC), comprising:
providing an IC carrier having a first chamber defined therein and a second chamber defined therein, an IC positioning magnet disposed within the first chamber, and an IC holder located within the second chamber and disposed over the IC positioning magnet within the first chamber, the second chamber being located entirely above the first chamber; and
holding, by the IC holder, the IC so as to provide the centering and the positioning of the IC relative to the IC positioning magnet.

16. The method according to claim 15, wherein the IC holder is formed with a receiving portion, and wherein the holding of the IC includes holding the IC by the receiving portion of the IC holder.

* * * * *